(12) United States Patent
Lin et al.

(10) Patent No.: US 9,867,312 B2
(45) Date of Patent: Jan. 9, 2018

(54) ELECTRONIC MODULE AND HEAT DISSIPATION MODULE

(71) Applicant: HTC Corporation, Taoyuan County (TW)

(72) Inventors: Hung-Wen Lin, Taoyuan County (TW); Ting-An Kuo, Taoyuan County (TW); Yu-Jing Liao, Taoyuan County (TW); I-Cheng Chuang, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 192 days.

(21) Appl. No.: 14/108,348

(22) Filed: Dec. 17, 2013

(65) Prior Publication Data
US 2015/0173237 A1   Jun. 18, 2015

(51) Int. Cl.
*H05K 7/20*   (2006.01)
*H05K 9/00*   (2006.01)
(Continued)

(52) U.S. Cl.
CPC ......... *H05K 7/20009* (2013.01); *F04D 33/00* (2013.01); *H01L 23/467* (2013.01);
(Continued)

(58) Field of Classification Search
CPC ...... H04R 2499/11; H04R 17/10; H04R 1/28; Y10T 29/53174
(Continued)

(56) References Cited

U.S. PATENT DOCUMENTS 6,917,142 B2 * 7/2005 Koyama ............. H03H 9/1021
310/344
7,092,254 B1 * 8/2006 Monsef ................ H01L 23/473
165/80.4
(Continued)

FOREIGN PATENT DOCUMENTS

CA   2872023   11/2013
CN   1397734   2/2003
(Continued)

OTHER PUBLICATIONS

1st-9th frames retrieved from http://www.gereports.com/here-come-the-cool-jets/, GE engineers, YouTube, Dec. 12, 2012, 1:17-1:21.
(Continued)

*Primary Examiner* — Robert J Hoffberg
*Assistant Examiner* — Matt Dhillon
(74) *Attorney, Agent, or Firm* — JCIPRNet

(57) ABSTRACT

An electronic module includes a substrate, a metallic shielding cover, an electronic component and a piezoelectric element. The metallic shielding cover is disposed on the substrate and forms an accommodating chamber together with the substrate, wherein the metallic shielding cover has an opening, and the accommodating chamber is communicated with outside via the opening. The electronic component is disposed on the substrate and accommodated in the accommodating chamber. The piezoelectric element is adhered to the metallic shielding cover, wherein the piezoelectric element after being enabled is configured to bring a local portion of the metallic shielding cover for vibrating to change the volume of the accommodating chamber. In addition, a heat dissipation module is also disclosed.

11 Claims, 3 Drawing Sheets

(51) Int. Cl.
  *H01L 23/467* (2006.01)
  *H01L 23/552* (2006.01)
  *F04D 33/00* (2006.01)
  *H05K 1/02* (2006.01)
  *H04R 17/00* (2006.01)

(52) U.S. Cl.
  CPC ......... *H01L 23/552* (2013.01); *H05K 1/0203* (2013.01); *H05K 7/20172* (2013.01); *H05K 9/0026* (2013.01); *H04R 17/00* (2013.01)

(58) Field of Classification Search
  USPC .................................. 435/91.2, 435, 289.1
  See application file for complete search history.

(56) References Cited

U.S. PATENT DOCUMENTS

| | | | | |
|---|---|---|---|---|
| 7,385,482 | B2* | 6/2008 | Wada | H04R 1/028 340/384.1 |
| 7,400,875 | B2* | 7/2008 | Konno | H04R 1/2892 381/388 |
| 7,602,110 | B2* | 10/2009 | Jeong | H01J 11/12 313/46 |
| 7,742,299 | B2* | 6/2010 | Sauciuc | H05K 7/20163 174/16.1 |
| 7,788,981 | B2* | 9/2010 | Schmid | G01L 15/00 361/283.1 |
| 7,957,140 | B2* | 6/2011 | Mongia | G06F 1/203 165/104.33 |
| 7,990,705 | B2 | 8/2011 | Bult et al. | |
| 8,064,221 | B2* | 11/2011 | Kuroda | H05K 3/3442 174/255 |
| 8,080,925 | B2* | 12/2011 | Berger | B81B 7/0058 310/329 |
| 8,116,062 | B2* | 2/2012 | Oh | H01G 9/0036 361/303 |
| 8,126,170 | B2* | 2/2012 | Yeates | H04R 17/00 381/174 |
| 8,212,454 | B2* | 7/2012 | Onitsuka | G04R 20/10 310/348 |
| 8,363,411 | B2* | 1/2013 | Stephens | H05K 7/20445 174/548 |
| 8,385,578 | B2* | 2/2013 | Onishi | H04R 17/00 381/390 |
| 8,421,543 | B2* | 4/2013 | Hsu | H03H 9/0547 331/158 |
| 8,457,333 | B2* | 6/2013 | Yeates | H04R 17/00 381/190 |
| 9,055,143 | B2* | 6/2015 | Kim | H04M 1/03 |
| 2003/0003879 | A1* | 1/2003 | Saiki | H04M 1/03 455/575.1 |
| 2008/0223141 | A1 | 9/2008 | Schmid et al. | |
| 2009/0002949 | A1 | 1/2009 | Pawlenko et al. | |
| 2012/0008805 | A1* | 1/2012 | Hachinohe | B81B 7/0064 381/163 |
| 2012/0148081 | A1* | 6/2012 | Yeates | H04R 17/00 381/345 |
| 2013/0235528 | A1 | 9/2013 | Lee et al. | |
| 2013/0255801 | A1* | 10/2013 | Hirata | F16K 31/126 137/505.14 |
| 2013/0260823 | A1* | 10/2013 | Shukla | H04M 1/0264 455/556.1 |
| 2013/0308799 | A1* | 11/2013 | Lin | H04R 1/02 381/190 |
| 2015/0111257 | A1* | 4/2015 | Dority | H04M 1/035 455/556.1 |

FOREIGN PATENT DOCUMENTS

| | | |
|---|---|---|
| CN | 101997509 | 3/2011 |
| CN | 102144409 | 8/2011 |
| CN | 103291597 | 9/2013 |
| TW | 558611 | 10/2003 |
| TW | 200417308 | 9/2004 |

OTHER PUBLICATIONS

10th-14th frames retrieved from http://www.gereports.com/here-come-the-cool-jets/, GE engineers, YouTube, Dec. 12, 2012, 2:16-2:19.
"Office Action of Europe Counterpart Application", dated Feb. 16, 2015, p. 1-p. 7.
"Office Action of European Counterpart Application", dated Feb. 3, 2015, p. 1-p. 3, in which the listed references were cited.
"Office Action of Taiwan Counterpart Application," dated Oct. 27, 2015, p. 1-p. 6, in which the listed references were cited.
"Office Action of China Counterpart Application", dated Sep. 18, 2016, p. 1-p. 9, in which the listed references were cited.

* cited by examiner

ELECTRONIC MODULE AND HEAT DISSIPATION MODULE

BACKGROUND OF THE APPLICATION

Field of the Application

The present application generally relates to a heat dissipation module, and more particularly, to an electronic module using the heat dissipation module.

Description of Related Art

In recent years, along with along the staggering advancements of science and technology, the electronic apparatuses of information products such as notebook (NB), tablet PC and smart phone have entered our daily life more frequently. The type and the function of the electronic apparatus become more and more diversified, and these electronic apparatuses get more popular thanks to the convenience and practicality thereof and can be applicable as per different purposes.

In an electronic apparatus, it usually includes a central processing unit (CPU), a system on chip (SOC) or other electronic components, which (in particular, CPU) however would produce a lot of thermal energy during operation, so that how to integrate an appropriate heat-dissipating design into an electronic apparatus gradually becomes a focus cared by the relevant industries.

SUMMARY OF THE APPLICATION

Accordingly, the present application is directed to an electronic module with heat-dissipating function.

The present application is also directed to a heat dissipation module with heat-dissipating function.

The electronic module of the application includes a substrate, a metallic shielding cover, an electronic component and a piezoelectric element. The metallic shielding cover is disposed on the substrate and forms an accommodating chamber together with the substrate, wherein the metallic shielding cover has an opening, and the accommodating chamber is communicated with outside via the opening. The electronic component is disposed on the substrate and accommodated in the accommodating chamber. The piezoelectric element is adhered to the metallic shielding cover, wherein the piezoelectric element after being enabled is configured to bring a local portion of the metallic shielding cover for vibrating to change volume of the accommodating chamber.

The heat dissipation module of the application includes a casing and a piezoelectric element. The casing has an accommodating chamber for accommodating a heat source, wherein the casing has an opening, and the accommodating chamber is communicated with outside via the opening. The piezoelectric element is adhered to the casing, wherein the piezoelectric element after being enabled is configured to bring a local portion of the casing for vibrating to change the volume of the accommodating chamber and make air flow into or out of the accommodating chamber via the opening.

Based on the aforementioned depiction, the casing of the heat dissipation module in the application has an accommodating chamber to accommodate a heat source, while the piezoelectric element of the heat dissipation module is adhered to the casing. Thus, the piezoelectric element after being enabled is configured to bring a local portion of the casing for vibrating to change the volume of the accommodating chamber and make air flow into or out of the accommodating chamber via the opening, so as to make the thermal energy of the heat source expelled out of the accommodating chamber. Similarly, the piezoelectric element of the electronic module in the application is adhered onto the metallic shielding cover, wherein the metallic shielding cover and the substrate together form the accommodating chamber, and the electronic component is located in the accommodating chamber. Thus, the piezoelectric element after being enabled is configured to bring a local portion of the metallic shielding cover for vibrating to change the volume of the accommodating chamber and, through airflow flows into or out of the accommodating chamber, so as to make the thermal energy of the electronic component expelled out of the accommodating chamber. Accordingly, the electronic module and the heat dissipation module of the application have heat-dissipating function.

In order to make the features and advantages of the present application more comprehensible, the present application is further described in detail in the following with reference to the embodiments and the accompanying drawings.

DESCRIPTION OF THE EMBODIMENTS

Figure 1:
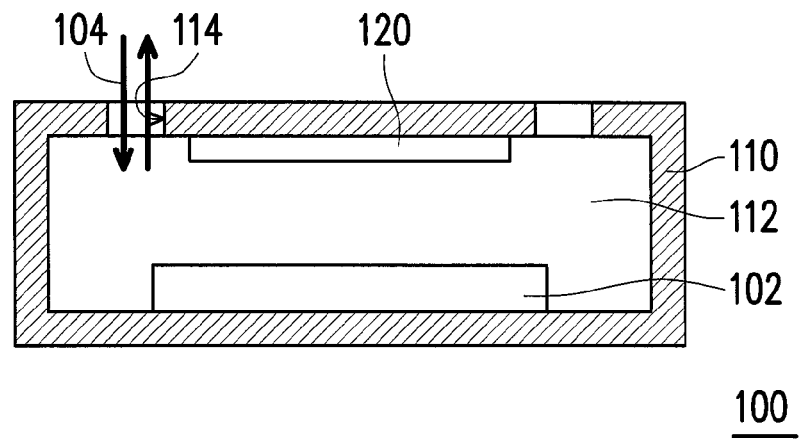
FIG. 1 is a schematic diagram of a heat dissipation module according to an embodiment of the invention.

FIG. 1 is a schematic diagram of a heat dissipation module according to an embodiment of the invention. Referring to FIG. 1, in the embodiment, a heat dissipation module 100 includes a casing 110 and a piezoelectric element 120. The casing 110 has an accommodating chamber 112 for accommodating a heat source 102, in which the casing 110 has an opening 114, and the accommodating chamber 112 is communicated with outside via the opening 114. On the other hand, the piezoelectric element 120 is adhered to the casing 110, in which the piezoelectric element 120 can be disposed at the inner-side of the casing 110 as shown by FIG. 1. In other unshown embodiments, the piezoelectric element 120 can be disposed at the outer-side of the casing 110 as well. Thus, after the piezoelectric element 120 being enabled, such as guiding an AC power into the piezoelectric element 120, the piezoelectric material (not shown) in the piezoelectric element 120 produces piezoelectricity effect to repeatedly stretch and shrink itself, so as to make the piezoelectric element 120 vibrate. At the time, since the piezoelectric element 120 in the embodiment is adhered to the casing 110, the piezoelectric element 120 after being enabled is adapted to bring a local portion of the casing 110 for vibrating to change volume of the accommodating chamber 112. In other words, in the embodiment, when the piezoelectric element 120 brings a local portion of the casing 110 for vibrating, the local portion of the casing 110 (for example, the upper half portion of the casing 110 in FIG. 1) moves back and forth relatively to the accommodating chamber 112 to make the volume of the accommodating chamber 112 repeatedly increased and decreased. At the time, the air 104 flows into or out of the accommodating chamber 112 via the opening 114 due to the volume variation of the accommodating chamber 112, where the flowing path is marked with an arrow head.

In more details, in the embodiment, the air 104 is sucked into the accommodating chamber 112 when the volume of the accommodating chamber 112 is increased and is expelled out of the accommodating chamber 112 when the volume of the accommodating chamber 112 is decreased. As a result, the air 104 not absorbing thermal energy yet flows into the accommodating chamber 112 from outside thereof, and the air 104 after absorbing the thermal energy of the heat source 102 flows out of the accommodating chamber 112 from inside of the accommodating chamber 112, so as to expel the thermal energy of the heat source 102 out of the accommodating chamber 112. In short, the heat dissipation module 100 gains the heat-dissipating function by disposing the piezoelectric element 120. In addition, in other unshown embodiments, the casing of the heat dissipation module can have multiple openings to increase the efficiency for the air to flow into and out of the accommodating chamber, so as to further advance the heat-dissipating efficiency of the heat dissipation module. Based on the aforementioned depiction, the piezoelectric element 120 is adhered to the casing, and the piezoelectric element 120 after being enabled brings a local portion of the casing 110 for vibrating, so as to make the air 104 flow into or out of the accommodating chamber 112 of the casing 110.

Figure 2:
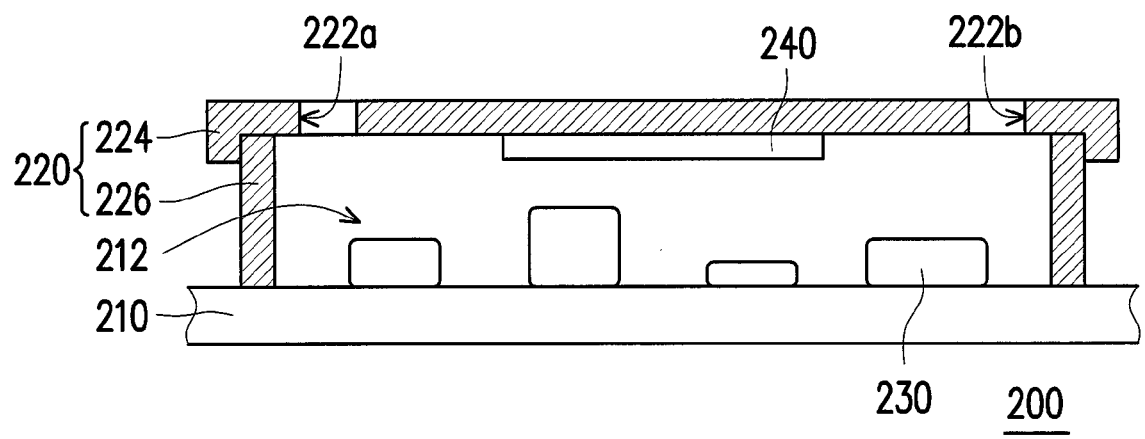
FIG. 2 is a schematic diagram of an electronic module according to another embodiment of the invention.

FIG. 2 is a schematic diagram of an electronic module according to another embodiment of the invention. Referring to FIG. 2, in the embodiment, an electronic module 200 includes a substrate 210, a metallic shielding cover 220, four electronic components 230 and a piezoelectric element 240. The metallic shielding cover 220 is disposed on the substrate 210 and forms the accommodating chamber 212 together with the substrate 210, in which the metallic shielding cover 220 has a first opening 222a and a second opening 222b. The accommodating chamber 212 is communicated with outside via the first opening 222a and the second opening 222b. The electronic components 230 are disposed on the substrate 210 and accommodated in the accommodating chamber 212. The piezoelectric element 240 is adhered to the metallic shielding cover 220, and the piezoelectric element 240 after being enabled is configured to bring a local portion of the metallic shielding cover 220 for vibrating to produce heat-dissipating effect.

Specifically in the embodiment, the substrate 210 is a circuit board, while the electronic components 230 can be a central processing unit (CPU), a radio frequency integrated circuit (RF IC), a charger integrated circuit (charger IC), a power amplifier (PA) or other components, wherein although there are four electronic components 230 are given in FIG. 2, but the application does not limit the type and the quantity of the electronic components 230. The electronic components 230 are disposed on the substrate 210 and electrically connected to the substrate 210, so as to perform the functions corresponding to the types. In order to avoid the electronic components 230 from electromagnetic interference, for example, to avoid the electromagnetic interference between electronic components 230 and other unshown electronic components during transmitting or receiving signals thereof, the metallic shielding cover 220 of the embodiment is disposed on the substrate 210 and, together with the substrate 210, forms the accommodating chamber 212, while the electronic components 230 are accommodated in the accommodating chamber 212. Thus, by using the accommodating chamber 212 composed of the metallic shielding cover 220 and the substrate 210, the electronic module 200 can shield the electronic components 230 to realize the electromagnetic shielding function. Meanwhile, by using the piezoelectric element 240 in association with the metallic shielding cover 220, the heat-dissipating effect is achieved. Similar to the design of the heat dissipation module 100 in FIG. 1, the piezoelectric element 240 of the embodiment is adhered to the metallic shielding cover 220, wherein the piezoelectric element 240 after being enabled is configured to bring a local portion of the metallic shielding cover 220 for vibrating to change the volume of the accommodating chamber 212, so that the air 202 (shown in FIGS. 3A and 3B) is adapted to flow into or out of the accommodating chamber 212 via the first opening 222a and the second opening 222b to absorb the thermal energy.

In the embodiment, the metallic shielding cover 220 includes a side-wall 226 and an upper cover 224. The side-wall 226 stands on the substrate 210 and surrounds the electronic components 230, and the upper cover 224 is disposed on the side-wall 226 and faces the substrate 210. The first opening 222a and the second opening 222b of the embodiment are on the upper cover 224, and the piezoelectric element 240 is located between the first opening 222a and the second opening 222b, so that the piezoelectric element 240 after being enabled brings the upper cover 224 for vibrating to change the volume of the accommodating chamber 212. However, in other unshown embodiments, the metallic shielding cover 220 can have one or multiple openings, and the openings can be disposed on the upper cover 224 or the side-wall 226. The application does not limit the quantity and position of the opening. Moreover, in other unshown embodiments, the application does not limit the piezoelectric element 240 to be located between the first opening 222a and the second opening 222b and does not limit the piezoelectric element 240 to be adhered at the inner-side of the metallic shielding cover 220, where the position of the piezoelectric element 240 is adjustable depending on the need, for example, adhered at the outer-side of the metallic shielding cover 220, which the application is not limited to.

Figure 3A:
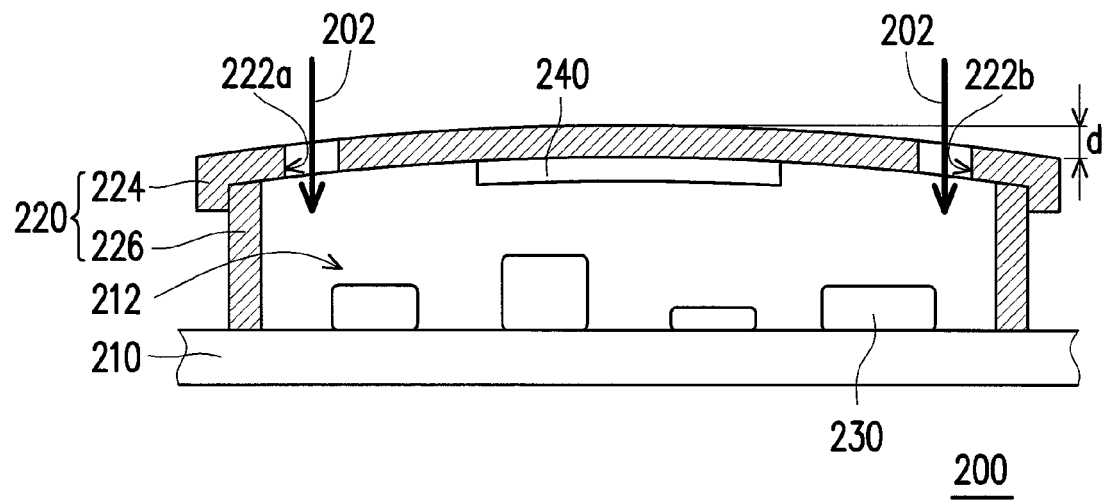
FIGS. 3A and 3B are action diagram of the electronic module of FIG. 2.
Figure 3B:
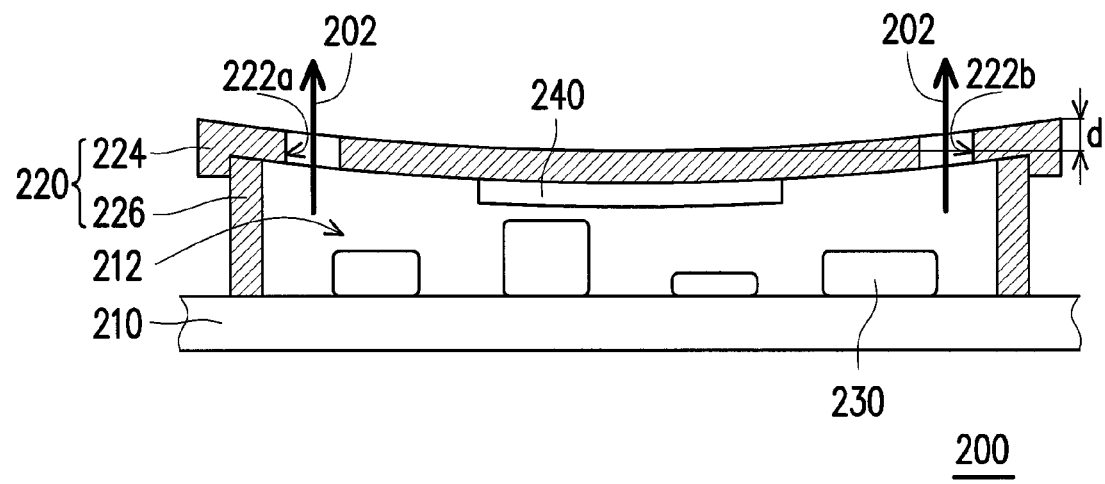

FIGS. 3A and 3B are action diagram of the electronic module of FIG. 2. Referring to FIGS. 3A and 3B, in the embodiment, before the piezoelectric element 240 is enabled, the air 202 has existed both in the accommodating chamber 212 and outside. After the piezoelectric element 240 is enabled, for example, an AC power is guided into the piezoelectric element 240, the piezoelectric element 240 will bring a local portion of the metallic shielding cover 220, for example, will bring the upper cover 224 where the piezoelectric element 240 is adhered to, for vibrating to change the volume of the accommodating chamber 212. For example, when the piezoelectric element 240 is in a negative voltage of the guided AC power, the piezoelectric element 240 makes a vibration move upwards as shown by FIG. 3A with an amplitude d, so as to bring the upper cover 224 moves outwards relatively to the accommodating chamber 212 to increase the volume of the accommodating chamber 212. At the time, the cold air 202 outside the accommodating chamber 212 would flow into the accommodating chamber 212 via the first opening 222a and the second opening 222b by means of the increased volume of the accommodating chamber 212 as shown by FIG. 3A (where the flowing path of the air 202 is marked in arrow heads). On contrary, when the piezoelectric element 240 is in a positive voltage of the guided AC power, the piezoelectric element 240 makes a vibration move downwards as shown by FIG. 3B with an amplitude d, so as to bring the upper cover 224 moves inwards relatively to the accommodating chamber 212 to decrease the volume of the accommodating chamber 212. At the time, the air 202 inside the accommodating chamber 212 would flow out of the accommodating chamber 212 via the first opening 222a and the second opening 222b by means of the decreased volume of the accommodating chamber 212 as shown by FIG. 3B (where the flowing path of the air 202 is marked in arrow heads). In this way, through guiding an AC power into the piezoelectric element 240, the piezoelectric element 240 is able to repeatedly bring the upper cover 224 for vibration relatively to the accommodating chamber 212 and, by means of changing the volume of the accommodating chamber 212, the air 202 is repeatedly sucked and expelled.

For better clarification, the amplitude d in FIGS. 3A and 3B is drawn more noticeable, however, it should be noted that FIGS. 3A and 3B are not real dimension proportioned, which are for schematic purpose only. The larger the amplitude d, the better the heat-dissipating effect of the electronic module 200 is. In the real design, the vibration amplitude d produced by the piezoelectric element 240 must take the space of the accommodating chamber 212 into account, i.e., the heat-dissipating design for the piezoelectric element 240 with the amplitude d to bring the upper cover 224 for vibration must not interfere the electronic components 230 in the accommodating chamber 212. Accordingly, the amplitude d should be adjustable depending on the need. In short, by using the piezoelectric element 240 to repeatedly bring the upper cover 224 for vibration, the air 202 not absorbing thermal energy yet can flow into the accommodating chamber 212 from outside of the accommodating chamber 212 and, after absorbing the thermal energy of the electronic component 230, the air 202 can flow out of the accommodating chamber 212 from the inside thereof, so as to expel the thermal energy of the electronic components 230 from the accommodating chamber 212. Thus, by disposing the piezoelectric element 240 on the metallic shielding cover 220 for realizing the electromagnetic shielding, and by enabling the piezoelectric element 240, the electronic module 200 can have the heat-dissipating function.

Figure 4:
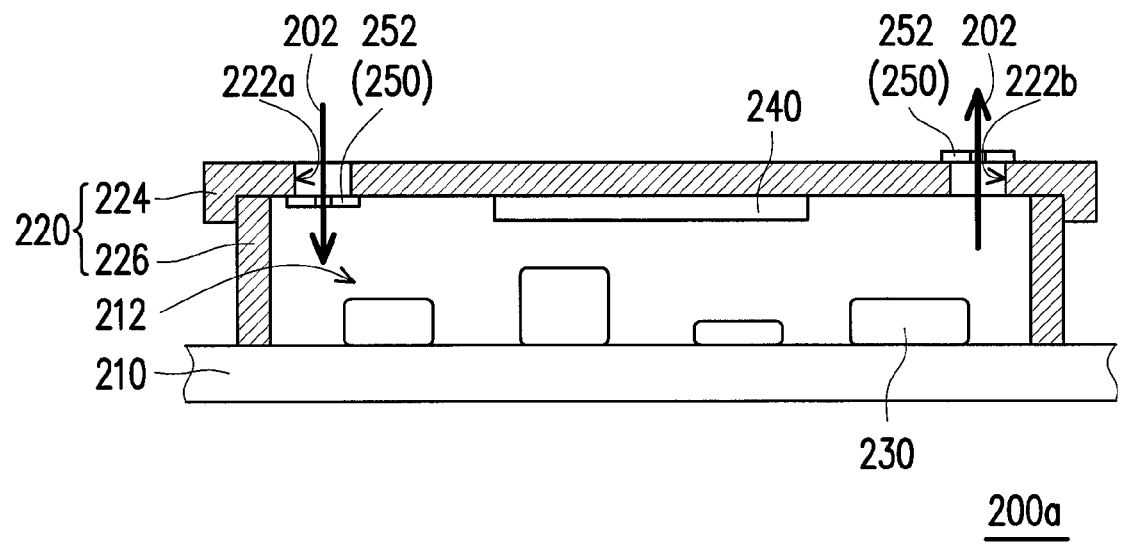
FIG. 4 is a schematic diagram of an electronic module according to yet another embodiment of the invention.

FIG. 4 is a schematic diagram of an electronic module according to yet another embodiment of the invention. Referring to FIG. 4, in the embodiment, the unique of the electronic module 200a from the aforementioned electronic module 200 rests in that the electronic module 200a further includes two check valves 250 respectively disposed at the first opening 222a and the second opening 222b, so as to make the first opening 222a and the second opening 222b serve as an inlet and an outlet. Specifically, in the above-mentioned electronic module 200, the accommodating chamber 212 is communicated with the outside via the first opening 222a and the second opening 222b, so that the cold air 202 can flow into the accommodating chamber 212 respectively via the first opening 222a and the second opening 222b and, after absorbing the thermal energy in the accommodating chamber 212, the air 202 can flow out of the accommodating chamber 212 respectively via the first opening 222a and the second opening 222b. On contrary, in the electronic module 200a of the embodiment, the two check valves 250 are respectively disposed at the first opening 222a and the second opening 222b, so that the air 202 flows into the accommodating chamber 212 via one of the openings and flows out of the accommodating chamber 212 via the other opening.

Taking an example, in the embodiment, the check valves 250 respectively include a barrier 252, wherein the barriers 252 are, for example, rubber, which the application is not limited to and the application does not limit the composition of the check valves 250 as well. One of the two barriers 252 is disposed at the first opening 222a and located at the inner-side of the upper cover 224, while the other of the two barriers 252 is disposed at the second opening 222b and located at the outer-side of the upper cover 224. When the piezoelectric element 240 after being enabled brings the upper cover 224 for vibrating, the upper cover 224 disturbs the surrounding air 202 to form an airflow. By means of the volume change of the accommodating chamber 212, the airflow flows into the accommodating chamber 212 from out of the accommodating chamber 212 via the first opening 222a and the barrier 252 and, after absorbing the thermal energy, flows out of the accommodating chamber 212 from the inside of the accommodating chamber 212 via the second opening 222b and the barrier 252. The flowing path of the air 202 in the airflow is represented with arrow heads in FIG. 4. After the air 202 in the airflow flows into the accommodating chamber 212 via the first opening 222a, the air 202 in the accommodating chamber 212 is obstructed by the barrier 252 located at the inner-side of the upper cover 224 to fail flowing out of the accommodating chamber 212 via the first opening 222a. Similarly, after the air 202 in the airflow flows out of the accommodating chamber 212 via the second opening 222b, the air 202 outside the accommodating chamber 212 is obstructed by the barrier 252 located at the outer-side of the upper cover 224 to fail flowing into the accommodating chamber 212 via the second opening 222b. In other words, the air 202 not absorbing thermal energy yet is allowed to flow into the accommodating chamber 212 via the first opening 222a, while the air 202 has absorbed thermal energy is allowed to flow out of the accommodating chamber 212 via the second opening 222b.

It can be seen that in the embodiment, by disposing the check valves 250, the heat content of the cold air 202 flowing into the accommodating chamber 212 is lower, so as to absorb more thermal energy in the accommodating chamber 212. After the air 202 absorbs the thermal energy to increase the heat content thereof, it flows out of the accommodating chamber 212. When the hot air 202 after absorbing thermal energy remains around the opening during flowing out of the accommodating chamber 212, this air 202 will not be able to immediately flow back to the accommodating chamber 212 through the same opening, so that the electronic module 200a has good heat-dissipating efficiency. However, the aforementioned layout is one of the embodiments of the application only, the application does not limit the quantity, the position and the type of the check valves 250, even not require to employ the check valves 250. In addition, when the casing 110 of the above-mentioned heat dissipation module 100 has multiple openings 114, the heat dissipation module 100 can dispose the aforementioned check valves 250 as well, so that one of the openings 114 serves as an inlet, while the other one of the openings 114 serves as an outlet, to advance the heat-dissipating efficiency. The detailed implementation can refer to the aforementioned electronic module 200a.

Referring to FIG. 2 again, in the embodiment, since the piezoelectric element 240 of the electronic module 200 is adhered to the upper cover 224 of the metallic shielding cover 220, the piezoelectric element 240 and the upper cover 224 can together form a buzzer. In more details, the electronic module usually can employ a single buzzer, so that the sound emitted by the buzzer can serve as an indication sound to operate the electronic module or an alert sound during the system or the electronic component is in abnormal operation. In the embodiment, for realizing the aforementioned heat-dissipating function, the piezoelectric element 240 is adhered to the upper cover 224 of the metallic shielding cover 220. The material of the upper cover 224 can be stainless steel, brass or other suitable metal. Therefore, after the piezoelectric element 240 is enabled to bring the upper cover 224 for vibrating and further to produce the aforementioned heat-dissipating function, the deformation of the piezoelectric element 240 makes the upper cover 224 made of metal produce sound. As a result, the additional buzzer can be omitted for the electronic module 200, and instead, the piezoelectric element 240 and the upper cover 224 of the metallic shielding cover 220 can serve as a buzzer. On the other hand, the embodiment can be understood as a design wherein the piezoelectric element 240 in the buzzer is combined with the metallic shielding cover 220 for electromagnetic shielding, so that the metallic shielding cover 220 and the piezoelectric element 240 can realize all the functions of the buzzer, the electromagnetic shielding and the heat-dissipating. In other words, the embodiment makes the parts combined with each other to realize different functions, i.e., the embodiment combines the metallic shielding cover 220 for electromagnetic shielding with the piezoelectric element 240 together to form a buzzer and, meanwhile, the piezoelectric element 240 brings the local portion of the metallic shielding cover 220 for vibrating to provide the heat-dissipating function.

In summary, the heat dissipation module of the application has a casing and a piezoelectric element. The casing has an accommodating chamber for accommodating a heat source, and the piezoelectric element is disposed on the casing. Thus, the piezoelectric element after being enabled brings a local portion of the casing for vibrating to change the volume of the accommodating chamber and make the air flow into or out of the accommodating chamber, so as to make the thermal energy of the heat source expelled out of the accommodating chamber. Similarly, the application applies the aforementioned design into an electronic module. In the electronic module of the application, the metallic shielding cover covers the electronic component disposed on the substrate, and the metallic shielding cover and the substrate together form the accommodating chamber to realize the electromagnetic shielding function. By disposing the piezoelectric element on the metallic shielding cover with electromagnetic shielding function, the electronic module can change the volume of the accommodating chamber through the piezoelectric element which after being enabled is configured to bring a local portion of the metallic shielding cover for vibrating. Therefore, the thermal energy of the electronic component can be expelled out of the accommodating chamber through the airflow entering or exiting from the accommodating chamber. Meanwhile, the piezoelectric element and the metallic shielding cover can together form a buzzer. In this way, the electronic module and the heat dissipation module of the application have heat-dissipating function. Moreover, the electromagnetic shielding and the buzzer function are integrated into the electronic module, so that the electronic module has diverse functions.

It will be apparent to those skilled in the art that the descriptions above are several preferred embodiments of the present application only, which does not limit the implementing range of the present application. Various modifications and variations can be made to the structure of the present application without departing from the scope or spirit of the present application. In view of the foregoing, the protective scope of the present application is given by the following claims and their equivalents.

What is claimed is:

1. An electronic module, comprising:
    a substrate;
    a metallic shielding cover, disposed on the substrate and forming an accommodating chamber together with the substrate, wherein the metallic shielding cover has an opening, and the accommodating chamber is communicated with outside via the opening;
    an electronic component, disposed on the substrate and accommodated in the accommodating chamber; and
    a piezoelectric element, directly adhered to an inner-side of the metallic shielding cover without covering the opening, wherein the piezoelectric element after being enabled is configured to bring a local portion of the metallic shielding cover for vibrating to change volume of the accommodating chamber, and wherein the opening and the piezoelectric element are disposed at a same side of the accommodating chamber.

2. The electronic module as claimed in claim 1, wherein the metallic shielding cover comprises a side-wall and an upper cover, the side-wall stands on the substrate and surrounds the electronic component, and the upper cover is disposed on the side-wall.

3. The electronic module as claimed in claim 2, wherein the opening is on the side-wall.

4. The electronic module as claimed in claim 2, wherein the opening is on the upper cover.

5. The electronic module as claimed in claim 4, wherein the piezoelectric element and the upper cover form a buzzer.

6. The electronic module as claimed in claim 1, further comprising:
    two check valves, wherein the opening comprises a first opening and a second opening, the two check valves are respectively disposed at the first opening and the second opening, so that the first opening and the second opening respectively serve as an inlet and an outlet.

7. The electronic module as claimed in claim 6, wherein the two check valves respectively comprise a barrier, one of the two barriers is disposed at the first opening and located at inner-side of the upper cover, the other one of the two barriers is disposed at the second opening and located at outer-side of the upper cover, an airflow flows into the accommodating chamber from out of the accommodating chamber via the first opening and then flows out of the accommodating chamber from inside of the accommodating chamber via the second opening.

8. The electronic module as claimed in claim 1, wherein the substrate comprises a circuit board, and the electronic component comprises central processing unit (CPU), radio frequency integrated circuit (RF IC), charger integrated circuit (charger IC) or power amplifier (PA).

9. A heat dissipation module, comprising:
    a casing, having an accommodating chamber for accommodating a heat source, wherein the casing has an opening, and the accommodating chamber is communicated with outside via the opening; and
    a piezoelectric element, directly adhered to an inner-side of the casing without covering the opening, wherein the piezoelectric element after being enabled is configured to bring a local portion of the casing for vibrating to change volume of the accommodating chamber and make air flow into or out of the accommodating chamber via the opening, and wherein the opening and the piezoelectric element are disposed at a same side of the accommodating chamber.

10. The heat dissipation module as claimed in claim 9, further comprising:
    two check valves, wherein the opening comprises a first opening and a second opening, the two check valves are respectively disposed at the first opening and the second opening, so that the first opening and the second opening respectively serve as an inlet and an outlet, air flows into the accommodating chamber from out of the accommodating chamber via the first opening and then flows out of the accommodating chamber from inside of the accommodating chamber via the second opening.

11. An electronic module, comprising:
a substrate;
a metallic shielding cover, disposed on the substrate and forming an accommodating chamber together with the substrate, wherein the metallic shielding cover has a first opening and a second opening, and the accommodating chamber is communicated with outside via the first opening and the second opening;
an electronic component, disposed on the substrate and accommodated in the accommodating chamber; and
a piezoelectric element, adhered to the metallic shielding cover and between the first opening and the second opening without covering the first opening and the second opening, wherein the piezoelectric element after being enabled is configured to bring a local portion of the metallic shielding cover for vibrating to change volume of the accommodating chamber.

\* \* \* \* \*